United States Patent
Ryu et al.

(10) Patent No.: US 8,405,094 B2
(45) Date of Patent: Mar. 26, 2013

(54) ENCAPSULATION SUBSTRATE FOR AN ORGANIC LIGHT EMITTING DIODE DISPLAY DEVICE

(75) Inventors: Ji-Hun Ryu, Yongin (KR); Seung-Yong Song, Yongin (KR); Young-Seo Choi, Yongin (KR); Oh-June Kwon, Yongin (KR); Kwan-Hee Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 80 days.

(21) Appl. No.: 12/827,022

(22) Filed: Jun. 30, 2010

(65) Prior Publication Data
US 2011/0031479 A1    Feb. 10, 2011

(30) Foreign Application Priority Data
Aug. 7, 2009    (KR) .................. 10-2009-0072805

(51) Int. Cl.
*H01L 27/15* (2006.01)
(52) U.S. Cl. ............... 257/79; 257/40; 257/66; 257/72
(58) Field of Classification Search ............. 257/66, 257/72, 59, 88, 79; 315/169; 345/76–77
See application file for complete search history.

(56) References Cited

U.S. PATENT DOCUMENTS

| | | | | |
|---|---|---|---|---|
| 6,897,087 B2 * | 5/2005 | Yanagawa et al. | | 438/99 |
| 2010/0108232 A1 * | 5/2010 | Chen et al. | | 156/60 |

FOREIGN PATENT DOCUMENTS

| | | |
|---|---|---|
| JP | 2003-100449 | 4/2003 |
| JP | 2004-207234 A | 7/2004 |
| JP | 2007-200884 A | 8/2007 |
| JP | 2008235089 | 10/2008 |
| KR | 10-2005-0022882 | 3/2005 |
| KR | 1020080010988 A | 1/2008 |
| KR | 10-2008-0084489 | 9/2008 |
| KR | 1020080087257 A | 10/2008 |

OTHER PUBLICATIONS

"Recent patents in fluid dispensing processes for electronics packaging", Authors: Minggan Li and Xiongbiao Chen, Recent Patents on Mechanical Engineering, vol. 2, No. 1, pp. 19-25, Jan. 2009.
"Dam and fill encapsulation for microelectronic packages", Authors: Steven J. Adamson and Christian Q. Ness Feb. 1999, National Electronic Packaging and Production Conference (NEPCON) West '99, Anaheim, CA.

* cited by examiner

*Primary Examiner* — Dung A. Le
(74) *Attorney, Agent, or Firm* — Robert E. Bushnell, Esq.

(57) ABSTRACT

An organic light emitting diode (OLED) display device and method of fabrication that includes a substrate having a device region, an outer dam region and an encapsulation region. The encapsulation region includes an inner dam region, an outer dam region and an encapsulation region that correspond to the device region. An encapsulation agent is formed in the encapsulation region of the encapsulation substrate, and filling dams are formed of the same material in the outer dam region and the inner dam region of the encapsulation substrate.

8 Claims, 5 Drawing Sheets

ENCAPSULATION SUBSTRATE FOR AN ORGANIC LIGHT EMITTING DIODE DISPLAY DEVICE

CLAIM OF PRIORITY

This application claims the benefit of Korean Patent Application No. 10-2009-0072805, filed on Aug. 7, 2009, in the Korean Intellectual Property Office, the disclosure of which is incorporated herein by reference.

BACKGROUND OF THE INVENTION

1. Field if the Invention

An aspect of the present invention relates to an encapsulation substrate, an organic light emitting diode (OLED) display device having the same, and a method of fabricating the same.

2. Description of the Related Art

In recent times, flat panel display devices such as liquid crystal display (LCD) devices, organic light emitting diode (OLED) display devices and plasma display panels (PDPs), which can overcome disadvantages of conventional display devices such as cathode ray tubes, have attracted attention.

The LCD devices are light-receiving devices, not self-emitting devices, so that they have limitations in brightness, contrast, a viewing angle and a large-sized screen, and the PDPs are self-emitting devices, but they are heavy, have high power consumption, and use a complicated fabrication method in comparison with other flat panel display devices.

On the other hand, the OLED display devices are self-emitting devices, so that they have a wide viewing angle, high contrast and low power consumption, and are lightweight and thin because they do not need a backlight. Moreover, the OELD display devices are capable of being driven at a direct current low voltage with high response time, strong to external impact since they are solid, used in wide range of temperature, and fabricated by a simple and inexpensive process.

However, organic thin films formed of organic compounds having low thermal resistance are very vulnerable to moisture, and a negative electrode formed on the organic thin films is degraded in performance due to oxidation. Thus, the organic thin films should be encapsulated to prevent invasion of moisture or oxygen.

The above information disclosed in this Related Art section is only for enhancement of understanding of the background of the invention and therefore it may contain information that does not form the prior art that is already known to a person of ordinary skill in the art.

SUMMARY OF THE INVENTION

Aspects of the present invention provide an organic light emitting diode (OLED) display device and a method of fabricating the same, which is capable of enhancing the mechanical strength of a glass frit.

Aspects of the present invention also provide an OLED display device and a method of fabricating the same, which is capable of enhancing the mechanical strength of a glass frit and providing a simple fabrication process.

According to an aspect of the present invention, an encapsulation substrate, includes: an encapsulation region in which an encapsulation agent is formed; an outer dam region formed within the encapsulation region; and an inner dam region formed within the outer dam region. Here, filling dams are formed of the same material in the outer dam region and the inner dam region.

According to another aspect of the present invention, an OLED display device, includes: a substrate including a device region, an outer dam region and an encapsulation region; and an encapsulation region including an inner dam region, an outer dam region and an encapsulation region to correspond to the device region, the outer dam region and the encapsulation region of the substrate, respectively. Here, an encapsulation agent is formed in the encapsulation region of the encapsulation substrate, and filling dams are formed of the same material in the outer dam region and the inner dam region of the encapsulation substrate.

The encapsulation agent may be a glass frit, which may be formed of one selected from the group consisting of lead oxide (PbO), diboron trioxide ($B_2O_8$), and silicon dioxide ($SiO_2$).

A gap may be defined between the outer dam region and the encapsulation region.

According to still another aspect of the present invention, a method of forming an encapsulation substrate, includes: providing an encapsulation substrate including an inner dam region, an outer dam region and an encapsulation region; applying an encapsulation agent to the encapsulation region; and forming an inner dam and an outer dam in the inner dam region and the outer dam region of the encapsulation substrate, respectively. Here, the outer dam is formed along an edge of the encapsulation substrate, and includes a discontinuous opening region.

According to yet another aspect of the present invention, a method of fabricating an OLED display device, includes: providing a substrate including a device region, an outer dam region, and an encapsulation region; providing an encapsulation substrate including an inner dam region, an outer dam region and an encapsulation region to correspond to the device region, the outer dam region and the encapsulation region of the substrate, respectively; applying an encapsulation agent to the encapsulation region of the encapsulation substrate; and forming an inner dam and an outer dam in the inner dam region and the outer dam region of the encapsulation substrate, respectively. Here, the outer dam is formed along an edge of the encapsulation substrate, and includes a discontinuous opening region.

The encapsulation agent may be a glass frit, which may be formed of one selected from the group consisting of lead oxide (PbO), diboron trioxide ($B_2O_8$), and silicon dioxide ($SiO_2$).

The inner dam and the outer dam may have a viscosity of 30000 to 1000000 cp.

The inner dam may include a linear inner dam and an oblique inner dam.

The inner dam may continuously extend from the outer dam.

The inner dam may be separated from the outer dam except for a region in which the inner dam continuously extends from the outer dam.

A gap may be defined between the outer dam region and the encapsulation region.

The method of fabricating the OLED display device may further include aligning the device region, the outer dam region and the encapsulation region of the substrate with the inner dam region, the outer dam region and the encapsulation region of the encapsulation region to correspond to each other, and combining the substrate with the encapsulation substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 4 through 6 illustrate a method of fabricating an OLED display device according to the present invention in which FIG. 5B is a cross-sectional view of FIG. 5A along line II-II.

DETAILED DESCRIPTION OF THE INVENTION

Figure 1:
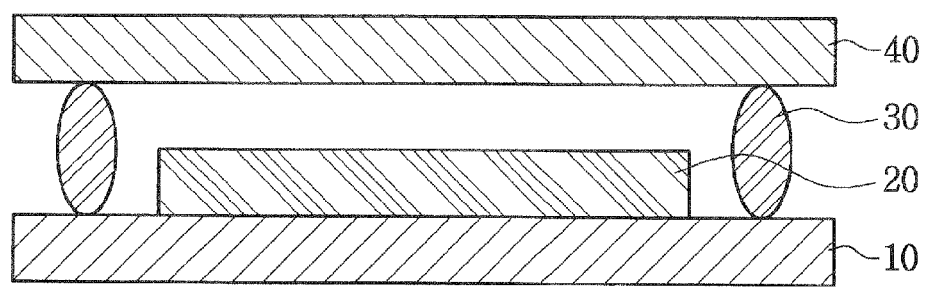
FIG. 1 is a cross-sectional view of a conventional organic light emitting diode (OLED) display device.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

FIG. 1 is a cross-sectional view of a conventional OLED display device.

Referring to FIG. 1, a substrate 10 is provided, and an OLED 20 is formed on the substrate 10. The OLED 20 includes a first electrode, an organic layer having at least an emission layer, and a second electrode.

A thin film transistor including a semiconductor layer, a gate electrode and source and drain electrodes may be further included.

Subsequently, an encapsulation substrate 40 is provided, a glass frit 30 is formed on one surface of the substrate 10 or encapsulation substrate 40 to combine.

Afterwards, laser is applied to the glass frit 30 to melt and solidify, and thus the conventional OLED display device is completed.

However, the glass frit has an excellent characteristic against the invasion of moisture or oxygen, but has very weak mechanical strength.

Figure 2:
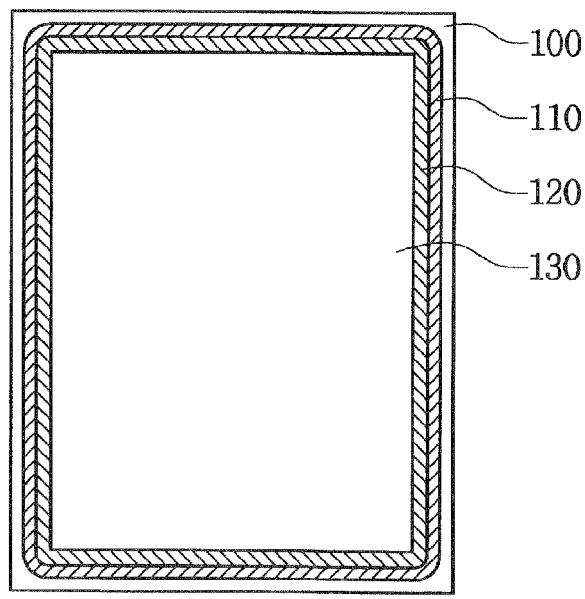
FIG. 2 is a schematic plan view of an encapsulation substrate having a typical structure.

FIG. 2 is a schematic plan view of an encapsulation substrate having a typical structure.

Referring to FIG. 2, the encapsulation substrate having a typical structure includes an encapsulation agent 110 formed on an encapsulation substrate 100, a dam 120 surrounded by the encapsulation agent 110, and an internal filling agent 130 surrounded by the dam.

Here, the encapsulation agent 110 is provided to seal a device substrate, on which an organic light emitting diode (OLED) is formed, and the encapsulation substrate 100. The internal filling agent 130 is provided to prevent an OLED display device from being damaged by external impact or pressure, and the dam 120 serves as a wall supporting the internal filling agent during the formation of the internal filling agent.

However, in the encapsulation substrate having the typical structure, the dam 120 and the internal filling agent 130 are formed of different materials, so that the dam 120 and the internal filling agent 130 should be formed in different processes. Thus, the fabrication process can be complicated.

Figure 3:
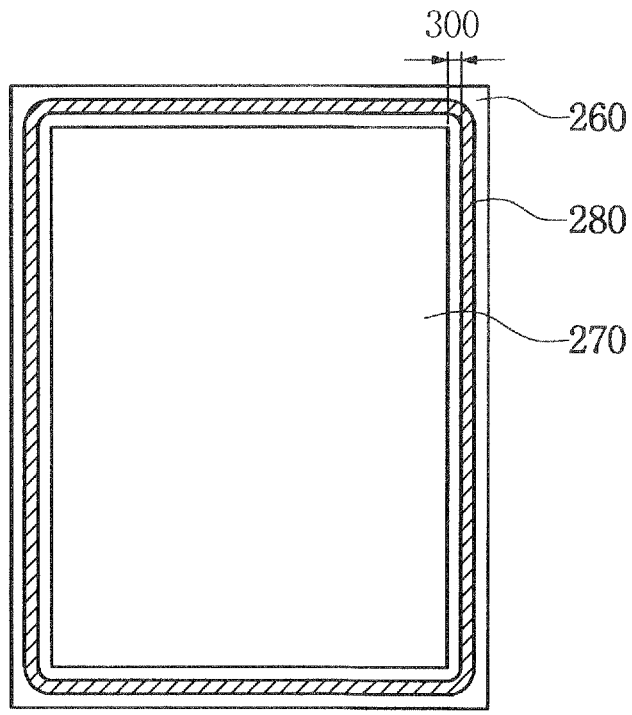
FIG. 3 is a schematic plan view of an encapsulation substrate according to the present invention.

FIG. 3 is a schematic plan view of an encapsulation substrate according to the present invention.

Referring to FIG. 3, the encapsulation substrate according to the present invention includes an encapsulation agent 280 formed on an encapsulation substrate 260, and a filling dam 270 surrounded by the encapsulation agent 280. A gap 300 is also defined between the filling dam and the encapsulation agent.

Here, the encapsulation agent 280 is provided to seal a device substrate, on which an OLED is formed, and the encapsulation substrate 260. The filling dam 270 is provided to prevent an OLED display device from being damaged by external impact or pressure.

Unlike the encapsulation substrate having the typical structure, the encapsulation substrate according to the present invention is configured so that the internal filling agent serving to prevent the OLED display device from being damaged by the external impact or pressure is integrated with a dam serving as a wall supporting the internal filling agent, thereby forming the filling dam.

The configuration of the encapsulation substrate according to the present invention will be described with reference to a method of fabricating an OLED display device according to the present invention in more detail below.

Figure 4:
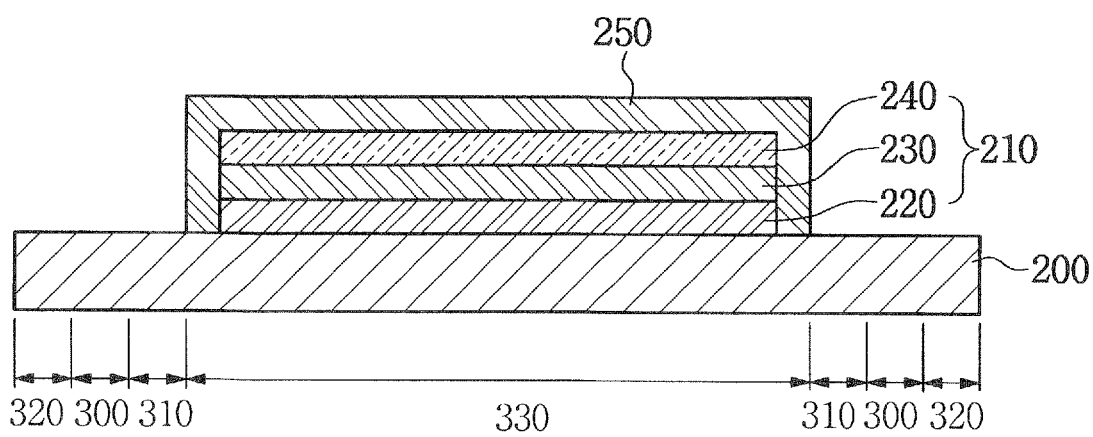
Figure 5A:
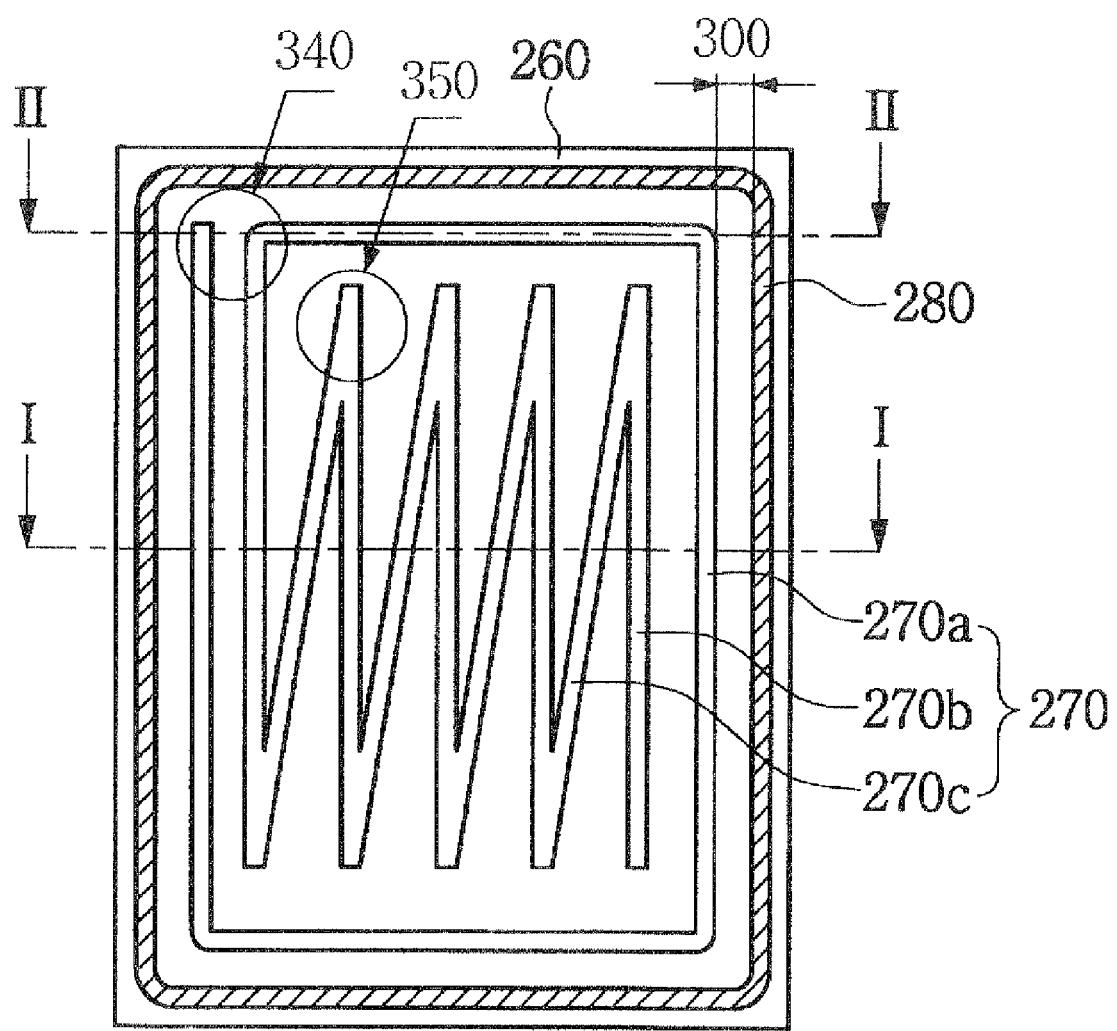
Figure 5B:
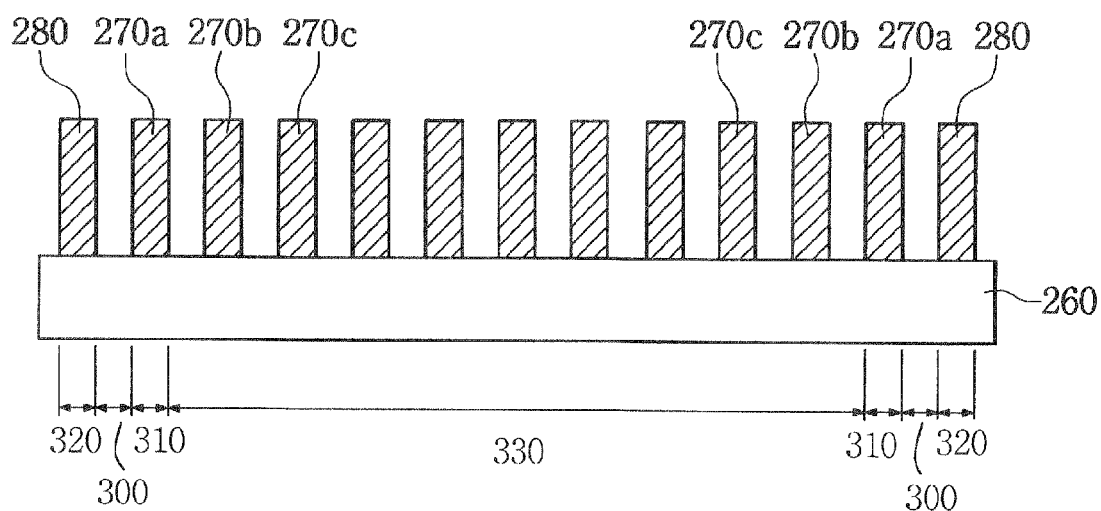
FIG. 5B is a cross-sectional view of FIG. 5A along line I-I.
Figure 5C:
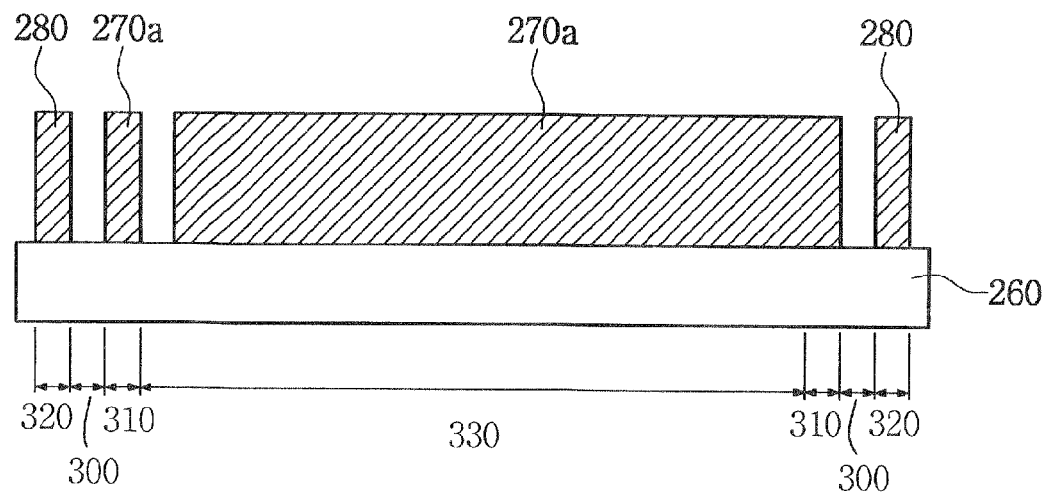
Figure 6:
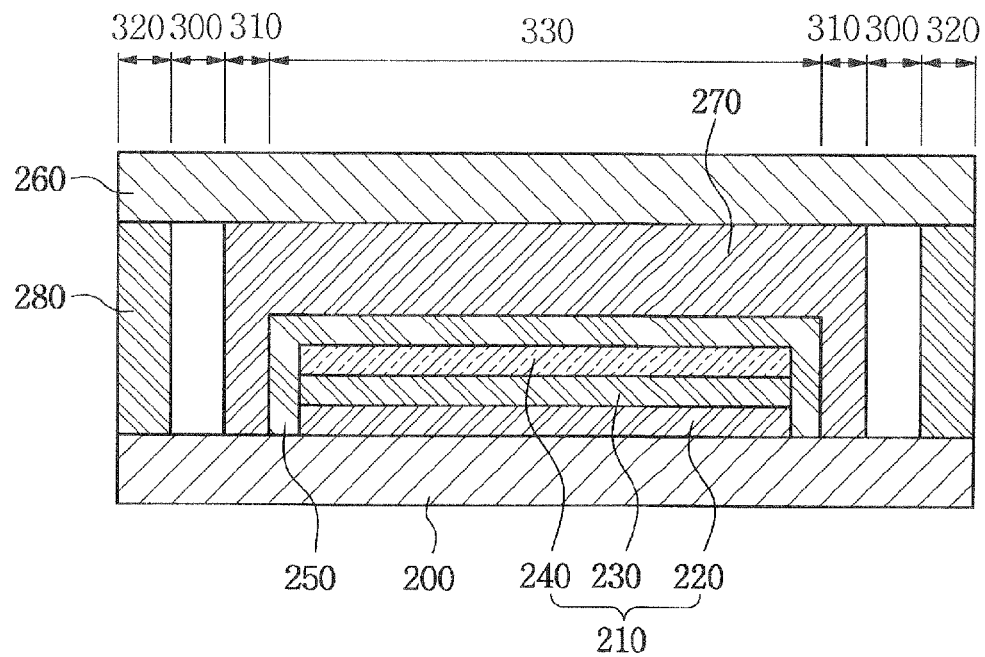

FIGS. 4 through 6 are cross-sectional views illustrating a method of fabricating an OLED display device according to the present invention.

To begin with, referring to FIG. 4, an OLED display device according to the present invention provides a substrate 200, which includes a device region 330, an outer dam region 310, and an encapsulation region 320. Here, a gap 300 is defined between the outer dam region 310 and the encapsulation region 320.

The substrate 200 may be an insulating substrate formed of glass or plastic, or a conductive substrate.

Subsequently, an OLED 210 is formed on the device region 330 of the substrate 200. The OLED 210 includes a first electrode 220, an organic layer 230 having at least one emission layer, and a second electrode 240.

In the OLED 210, the first electrode 220 may be a reflective electrode. The reflective electrode may be formed by sequentially stacking a reflective layer and a transparent electrode. The reflective layer is formed of one selected from the group consisting of Ag, Mg, Al, Pt, Pd, Au, Ni, Nd, Ir, Cr and compounds thereof, and the transparent electrode is formed of one selected from the group consisting of indium tin oxide (ITO), indium zinc oxide (IZO), tin oxide (TO) and zinc oxide (ZnO).

The first electrode 220 may also be formed in a stacked structure of a lower electrode layer, a reflective electrode layer and an upper electrode layer.

The lower electrode layer may be formed of one selected from the group consisting of ITO, IZO, TO and ZnO. Here, the lower electrode layer is formed to a thickness of 50 to 100 Å. When the thickness of the lower electrode layer is less than 50 Å, it is difficult to ensure uniformity, and when the thickness of the lower electrode layer is more than 100 Å, an adhesive strength is reduced due to stress of the lower electrode layer.

The reflective electrode layer may be formed of one selected from the group consisting of Al, an Al alloy, Ag and an Ag alloy. Here, the reflective electrode layer may be formed to a thickness of 900 to 2000 Å. When the thickness of the reflective electrode layer is less than 900 Å, light is partially transmitted, and the thickness of about 1000 Å is the minimum thickness that is not capable of transmitting light. In addition, when the thickness of the reflective electrode layer is more than 2000 Å, it is not preferable in terms of production cost and time.

Here, the reflective electrode layer may reflect light to increase brightness and luminous efficiency.

The upper electrode layer may be formed of one selected from the group consisting of ITO, IZO, TO and ZnO. Here, the upper electrode layer is formed to a thickness of 50 to 100 Å. When the thickness of the upper electrode layer is less than 50 Å, it is difficult to ensure uniformity of a thin film. When the thickness of the upper electrode layer is more than 100 Å, reflectance is reduced by at least 10 to 15%, particularly in a blue region, due to interference.

The OLED of the present invention is a top-emission type. If the first electrode can be used for the top-emissive OLED, the material and stacked structure of the first electrode are not limited.

The organic layer 230 includes at least an emission layer, and may also include at least one of a hole injection layer, a hole transport layer, an electron transport layer and an electrode injection layer. In the present invention, the configuration and material of the organic layer are not limited.

As a material for the hole transport layer, N,N'-di(naphthalene-1-yl)-N,N'-diphenyl-benzidine (α-NPB) or N,N'-bis(3-methylphenyl)-N,N'-diphenyl-[1,1'-biphenyl]-4,4'-diamine (TPD) may be used. The hole transport layer may be formed to a thickness of 10 to 50 nm. When the thickness of the hole transport layer exceeds the range, a hole injection characteristic is degraded, which is not preferable.

In addition to the material for the hole transport layer, a dopant capable of emitting light by electron-hole combination may be added to the hole transport layer. As such a dopant, 4-(dicyanomethylene)-2-tert-butyl-6-(1,1,7,7-tetramethyljulolidyl-9-enyl)-4H-pyran (DCJTB), coumarin 6, rubrene, DCM, perylene or quinacridone may be used, and its content may be 0.1 to 5 wt % of the total weight of the material for the hole transport layer. When the dopant is added during the formation of the hole transport layer, the color of emitted light can be controlled according to the kind and content of the dopant, and thus thermal stability of the hole transport layer is improved and a life span of the device increases.

The hole injection layer may be formed of a starburst amine-based compound to have a thickness of 30 to 100 nm. When the thickness of the hole injection layer exceeds the range, the hole injection characteristic is degraded, which is not preferable. The contact resistance between a counter electrode and the hole transport layer may be reduced due to the hole injection layer, and the hole transporting ability of an anode electrode may be improved, so that the characteristics of the device are improved in general.

A material for the emission layer of the present invention is not particularly limited, and may be 4,4'-bis(carbazol-9-yl)-biphenyl (CBP).

The emission layer of the present invention may further include a dopant capable of emitting light by the electron-hole combination, like the hole transport layer described above, and the kind and content of the dopant are almost the same as those of the hole transport layer. Here, the emission layer may be formed to a thickness of 10 to 40 nm.

As a material for the electron transport layer, tris(8-quinolinolate)-aluminum (Alq3) or Almq3 may be used, and the electron transport layer may further include a dopant capable of emitting light by the electron-hole combination, like the hole transport layer described above. Here, the kind and content of the dopant may be almost the same as those of the hole transport layer, and the electron transport layer may be formed to a thickness of 30 to 100 nm. When the thickness of the electron transport layer exceeds the range, efficiency is reduced and a driving voltage increases, which are not preferable.

A hole blocking layer may be further formed between the emission layer and the electron transport layer. Here, the hole blocking layer may prevent the transport of an exciton, which is formed from a phosphorescent light emitting material, to the electron transport layer, or prevent the transport of a hole to the electron transport layer. As a material for the hole blocking layer, Balq may be used.

The electron injection layer may be formed of a material including LiF, and formed to a thickness of 0.1 to 10 nm. When the thickness of the electron injection layer exceeds the range, the driving voltage increases, which is not preferable.

The second electrode 240 formed on the organic layer is formed in a semi-transmissive cathode type, or in a structure in which a transmissive cathode type is stacked on a semi-transmissive cathode. The semi-transmissive cathode type second electrode may be thinly formed to a thickness of 5 to 30 nm using one selected from the group consisting of Li, Ca, LiF/Ca, LiF/Al, Al, Mg and an Mg alloy. The second electrode having the stacked structure of the transmissive cathode type on the semi-transmissive cathode may be formed by sequentially forming a semi-transmissive type cathode using one selected from the group consisting of metals having small work functions such as Li, Ca, LiF/Ca, LiF/Al, Al, Mg and an Mg alloy, and a layer using ITO or indium zinc oxide (IZO), which has a low resistance characteristic. Here, when the thickness of the semi-transmissive cathode is less than 5 nm, an electron is not injected at a low voltage, and when the thickness of the semi-transmissive cathode is more than 30 nm, transmittance is significantly reduced. It is preferable that the total thickness of the semi-transmissive cathode and the transmissive cathode is 10 to 400 nm.

The OLED of the present invention is a top-emission type. If the second electrode can be used for the top-emissive OLED, the material and stacked structure of the second electrode are not limited.

Not shown in the drawings, the OLED 210 may further include a thin film transistor including a semiconductor layer, a gate electrode, and source and drain electrodes.

The thin film transistor may be formed in a top-gate structure in which a gate electrode is formed on a semiconductor layer, or in a bottom-gate structure in which a gate electrode is formed under a semiconductor layer.

Subsequently, a protective layer 250 surrounding the OLED 210 is formed.

The protective layer 250 may be formed of an organic layer, an inorganic layer, or a multiple layer thereof. The inorganic layer may be an insulating layer formed of silicon oxide ($SiO_2$), silicon nitride ($SiN_x$), or silicon oxynitride ($SiO_xN_y$), or a LiF layer. Meanwhile, the organic layer may be a layer containing N,N'-bis(naphthalene-1-yl)-N,N'-bis(phenyl)benzidine) (NPB), TNATA, TCTA, TDAPB, TDATA, Alq3, Balq or CBP.

The protective layer 250 may be formed by evaporation, CVD, or sputtering. The protective layer 250 may protect the organic layer from external moisture or oxygen to prevent deterioration of the device.

Here, when the protective layer is formed of an inorganic layer, it may be formed by sputtering, and when the protective layer is formed of an organic layer, it may be formed by evaporation or CVD.

However, when the protective layer is formed by sputtering, the OLED may be damaged. Thus, it is preferable that the protective layer is formed by evaporation or CVD, which causes less damage to the OLED. Therefore, it is preferable that the protective layer is formed of an organic layer.

Since the OLED according to the present invention is a top-emission type, the protective layer may be transparent.

Next, a method of forming an encapsulation substrate according to the present invention will be described with reference to FIGS. 5A through 5C. FIG. 5A is a schematic plan view of an encapsulation substrate according to the present invention, FIG. 5B is a cross-sectional view taken along line I-I' of FIG. 5A, and FIG. 5C is a cross-sectional view taken along line II-II' of FIG. 5A.

Referring to FIGS. 5A through 5C, an encapsulation substrate 260 including an inner dam region 330, an outer dam region 310, and an encapsulation region 320 is provided to correspond to the substrate 200 including the device region 330, the outer dam region 310 and the encapsulation region 320, described above. A gap 300 is also defined between the outer dam region 310 and the encapsulation region 320 of the encapsulation substrate, corresponding to the substrate.

The method of forming the encapsulation substrate will be described specifically below.

First, an encapsulation agent is applied to the encapsulation region 320 formed along an edge of the encapsulation substrate 260.

The encapsulation substrate 260 may be formed of an insulating material such as glass or plastic. The encapsulation agent may be a glass frit 280, which is formed by melting one selected from the group consisting of lead oxide (PbO), diboron trioxide ($B_2O_3$) and silicon dioxide ($SiO_2$) to make glass, and grinding the glass into powder. Here, the glass frit 280 may be applied by screen printing or dispensing.

The encapsulation agent is provided to seal the device substrate 200, on which an OLED is formed, and the encapsulation substrate 260. In the present invention, as the glass frit is used as the encapsulation agent to encapsulate the encapsulation substrate with the substrate, the invasion of external moisture or oxygen may be effectively prevented.

Afterwards, a filling dam 270 is formed a predetermined distance of gap 300 apart from the encapsulation agent applied to the encapsulation region 320.

The filling dam 270 is formed within the encapsulation agent, and includes an outer dam 270a formed along the edge of the encapsulation substrate, and inner dams 270b and 270c formed within the outer dam 270a formed along the edge of the encapsulation substrate.

The inner dams 270b and 270c and the outer dam 270a are disposed in an inner dam region 330 and an outer dam region 310 of the encapsulation substrate, respectively, and may be formed by screen printing or dispensing.

Here, the filling dam 270 may be formed of an UV- or heat-curing material such as a silicon-based resin, an epoxy-based resin, an acryl-based resin or a polyimide-based resin, but in the present invention, the material of the filling dam is not limited thereto.

The filling dam according to the present invention may have a viscosity of 30000 to 1000000 cp. Here, the OLED according to the present invention is a top-emission type, so that the material of the filling dam may be transparent.

The inner dams 270b and 270c are formed between the encapsulation substrate and the substrate to enhance mechanical strength of the glass frit.

The glass frit has an excellent characteristic against the invasion of moisture or oxygen, but has very weak mechanical strength. Thus, to reinforce the strength of the glass fit, the inner dams are formed between the encapsulation substrate and the substrate to serve as internal filling agents, thereby preventing the glass fit from being damaged by external impact or pressure, and also preventing the damage to the OLED display device.

Further, the outer dam 270a serves as a wall supporting the inner dams 270b and 270c.

To be specific, according to a subsequent process, the inner dams 270b and 270c spread all over an inner side of the outer dam to serve as internal filling agents. If the outer dam 270a serving as a wall does not exist, the inner dam spreads up to the region in which the glass frit is formed, to be in contact with the glass frit, resulting in degradation in adhesive strength of the glass frit. To prevent this, the outer dam 270a is needed.

Meanwhile, the gap 300 is defined between the outer dam region 310 and the encapsulation region 320 to prevent degradation of the adhesive strength of the glass fit generated by contacting the spreading outer dam and the glass frit.

Here, as can be seen from outer dam gap region 340 of FIG. 5A, the outer dam 270a includes a discontinuous opening region, which is not continuously formed along the edge of the encapsulation substrate.

As can be seen from FIG. 5A, the inner dam includes a linear inner dam 270b and an oblique inner dam 270c, and as can be seen from outer dam gap region 340 of FIG. 5A, the inner dam continuously extends from the outer dam 270a.

The inner dams 270b and 270c are separated from the outer dam 270a except for a region in which the inner dam continuously extends from the outer dam 270a.

As described above, the encapsulation substrate 260 including the inner dam region 330, the outer dam region 310 and the encapsulation region 320 is formed to correspond to the substrate 200 including the device region 330, the outer dam region 310 and the encapsulation region 320. That is, the device region 330 of the substrate is formed to correspond to the inner dam region 330 of the encapsulation substrate.

The characteristics described above will be described in further detail with reference to a following process.

Referring to FIG. 6, the encapsulation substrate 260 formed as described above is aligned with the substrate 200 formed as described above to combine.

That is, the device region 330, the outer dam region 310 and the encapsulation region 320 of the substrate 200 are aligned with the inner dam region 330, the outer dam region 310 and the encapsulation region 320 of the encapsulation substrate 260 to correspond to each other, and the both substrates 200 and 260 are combined with each other.

Here, the device region 330 of the substrate is aligned with the inner dam region 270b of the encapsulation substrate to correspond to each other.

The inner dams 270b and 270c spread all over the inner side of the outer dam due to the combination of the substrate with the encapsulation substrate, and thus serve as internal filling agents.

Here, as described above, the outer dam 270a includes the opening region, which is not continuously formed along the edge of the encapsulation substrate. The inner dams are separated from the outer dam 270a except for the region in which the inner dam continuously extends from the outer dam 270a.

According to the present invention, since air or bubbles are present in a predetermined space defined between the inner dams, the outer dam and the inner dams are formed to provide a path for exhausting the air or bubbles during the process of combining the substrate with the encapsulation substrate.

To this end, when the substrate is combined with the encapsulation substrate, the inner dams fill the predetermined space therebetween and spread all over the inner side of the outer dam. Here, to exhaust the air or bubbles present in the predetermined space, the opening region is formed in the outer dam.

In addition, the inner dams are separated from the outer dam not to trap the air or bubbles in the space defined by contact between the outer dam and the inner dam.

Here, the air or bubbles exhausted through the opening region of the outer dam may be exhausted outside through the encapsulation agent. Up to the present process, the encapsulation agent, the glass fit, was not cured, so that the air or bubbles can be exhausted outside through the encapsulation agent.

In the present invention, the outer dam and the inner dams are continuously formed only by once process.

Figure 7:
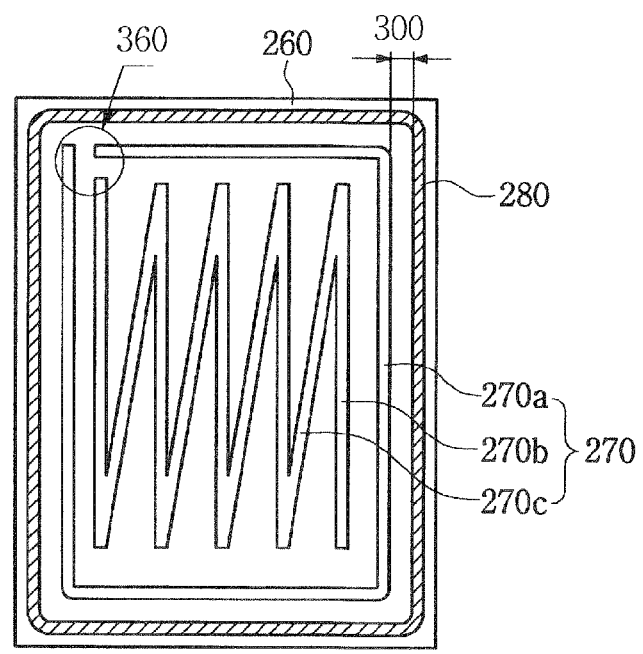
FIG. 7 is a schematic plan view illustrating another configuration of an encapsulation substrate according to the present invention.

On the other hand, FIG. 7 is a schematic plan view illustrating another configuration of an encapsulation substrate according to the present invention. As can be seen from outer and inner dam gap region 360 of FIG. 7, an outer dam and inner dams may be separated from each other without a region in which the inner dam continuously extends from the outer dam.

According to the present invention, the inner dam includes a linear inner dam 270b and an oblique inner dam 270c.

During the formation of the inner dam, as shown in inner dam connection region 350 of FIG. 5A, materials for the inner dams are concentrated in a certain region, in which ends of the inner dams are in contact with each other, thereby trapping air or bubbles. To prevent this, in the present invention, it is preferable that the oblique inner dam is formed.

For example, as can be seen from FIG. 5B, the number of the inner dams are nine. If all of the inner dams, not just some, are formed in a linear type, a distance between ends of the inner dams becomes smaller than the case that some of the inner dams are formed in an oblique type in the same space. Thus, when the substrate is combined with the encapsulation substrate, the ends of the inner dams are in contact with each other first, thereby trapping the air or bubbles.

Therefore, the distance between the ends of the inner dams can become greater by forming some of the inner dams in an oblique type. Thus, it is preferable that the inner dam according to the present invention includes the linear inner dam 270b and the oblique inner dam 270c.

As described above, the filling dam according to the present invention may have a viscosity of 30000 to 1000000 cp. When the viscosity of the filling dam is less than 30000 cp, liquidity of the filling dam increases due to the very low viscosity, and thus the inner dams can be in contact with each other, or the inner dam is in contact with the outer dam, thereby trapping the air or bubbles.

During the process of combining the substrate with the encapsulation substrate, the inner dams fill the predetermined space therebetween, and spread all over the inner side of the outer dam. Here, when the viscosity of the filling dam is more than 1000000 cp, due to very high viscosity, the liquidity of the filling dam decreases, and thus it is difficult that the inner dams spread all over the inner side of the outer dam.

Meanwhile, the device region 330 of the substrate is aligned with the inner dam region 330 of the encapsulation substrate to correspond to each other. This is for only an inner dam formed in the inner dam region of the encapsulation substrate to be pressed by a device formed on the device region of the substrate in order to spread all over the inner side of the outer dam.

This is because if the device region of the substrate is formed up to the outer dam region of the encapsulation substrate, beyond the inner dam region of the encapsulation substrate, the outer dam in the outer dam region of the encapsulation substrate is pressed out to the encapsulation agent by the device formed on the device region of the substrate, to be in contact with the encapsulation agent.

To solve this problem, as described above, in the present invention, it is preferable that the gap 300 is defined between the outer dam region 310 and the encapsulation region 320, and thus the contact between the outer dam and the encapsulation agent can be prevented.

Subsequently, laser is applied to the glass frit 280 to melt and solidify, and then heat or UV is applied to the filling dam to cure. Thus, an OLED display device according to the present invention is completed.

In the OLED display device completed as described above, the encapsulation substrate corresponds to the encapsulation substrate of FIG. 3. As described above, unlike the encapsulation substrate formed in the typical structure, the internal filling agent provided to prevent the OLED display device from being damaged by external impact or pressure may be formed using the same material and process as the dam serving as a wall supporting the internal filling agent, which can provide a simple fabrication process.

Consequently, the present invention provides an OLED display device and a method of fabricating the same, which has an excellent characteristic against invasion of moisture or oxygen by combining a substrate with an encapsulation substrate using a glass fit.

The present invention also provides an OLED display device and a method of fabricating the same, which is capable of enhancing mechanical strength of the glass frit.

The present invention also provides an OLED display device and a method of fabricating the same, which is capable of providing a simple fabrication process as well as enhancing mechanical strength of a glass frit.

In the exemplary embodiments shown in FIG. 5A and FIG. 7 the linear inner dams 270b and oblique inner dam 270c are connected at inner dam connection region 350 and form a zigzag pattern in which the linear inner dams 270b and the oblique inner dam 270c are at an angle of between 120° and 180°. However, the present invention is not limited to such a zigzag pattern.

Although the present invention has been described with reference to predetermined exemplary embodiments thereof, it will be understood by those skilled in the art that a variety of modifications and variations may be made to the present invention without departing from the spirit or scope of the present invention defined in the appended claims and their equivalents.

What is claimed is:

1. An encapsulation substrate, comprising:
- an encapsulation region in which an encapsulation agent is formed, the encapsulation agent being a glass frit;
- an outer dam region formed within the encapsulation region, said outer dam region having a discontinuous opening region and a gap between the outer dam region and the encapsulation region;
- an inner dam region formed within the outer dam region; and
- filling dams formed of the same material in the outer dam region and the inner dam region.

2. The encapsulation substrate according to claim 1, wherein the glass frit is formed of one selected from the group consisting of lead oxide (PbO), diboron trioxide ($B_2O_8$), and silicon dioxide ($SiO_2$).

3. The encapsulation substrate according to claim 1, wherein each of the filling dams is formed of an UV- or heat-curing material.

4. An organic light emitting diode (OLED) display device, comprising:
- a substrate including a device region, an outer dam region and an encapsulation region, the encapsulation region including an inner dam region, the outer dam region, and the encapsulation region encompassing the device region and the outer dam region of the substrate, respectively, said outer dam region having a discontinuous opening region and a gap between the outer dam region and the encapsulation region;
- an encapsulation agent formed in the encapsulation region of the encapsulation substrate, said encapsulation agent being a glass frit; and
- filling dams formed of the same material in the outer dam region and the inner dam region of the encapsulation substrate.

5. The OLED display device according to claim 4, further comprising an OLED formed on the device region of the substrate.

6. The OLED display device according to claim 4, wherein the glass frit is formed of one selected from the group consisting of lead oxide (PbO), diboron trioxide ($B_2O_8$), and silicon dioxide ($SiO_2$).

7. The OLED display device according to claim 4, wherein each of the filling dams is formed of a transparent material.

8. The OLED display device according to claim 4, wherein the OLED further includes a thin film transistor having a semiconductor layer, a gate electrode, and source and drain electrodes.

* * * * *